(12) United States Patent
Hanriat et al.

(10) Patent No.: US 6,253,352 B1
(45) Date of Patent: Jun. 26, 2001

(54) CIRCUIT FOR VALIDATING SIMULATION MODELS

(75) Inventors: Stéphane Hanriat, Saint Vincent de Mercuze; Jean-Pierre Schoellkopf, Grenoble, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/119,424

(22) Filed: Jul. 20, 1998

(30) Foreign Application Priority Data

Jul. 21, 1997 (FR) .................................................. 97 09529

(51) Int. Cl.$^7$ ............................ G06F 17/50; H03H 11/26
(52) U.S. Cl. ..................... 716/4; 716/8; 716/6; 327/276; 327/277; 703/15
(58) Field of Search ............................................. 716/4, 6

(56) References Cited

U.S. PATENT DOCUMENTS

| | | | |
|---|---|---|---|
| 4,458,165 | * 7/1984 | Jackson | 307/595 |
| 4,712,061 | * 12/1987 | Lach | 324/83 |
| 4,782,283 | * 11/1988 | Zasio | 324/73 |
| 4,845,390 | * 7/1989 | Chan | 307/602 |
| 5,083,299 | * 1/1992 | Schwanke et al. | 368/113 |
| 5,355,097 | 10/1994 | Scott et al. | 331/1 A |
| 5,428,626 | * 6/1995 | Frisch et al. | 371/27 |
| 5,471,176 | * 11/1995 | Henson et al. | 331/1 |
| 5,561,692 | 10/1996 | Maitland et al. | 375/371 |
| 5,570,294 | 10/1996 | McMinn et al. | 364/481 |
| 5,594,690 | * 1/1997 | Rothenberger et al. | 365/189.01 |
| 5,644,261 | * 7/1997 | Frisch et al. | 327/277 |
| 5,671,151 | * 9/1997 | Williams | 364/489 |
| 5,731,725 | * 3/1998 | Rothenberger et al. | 327/262 |
| 5,811,983 | * 9/1998 | Lundberg | 324/763 |
| 5,861,780 | * 1/1999 | Fukuda | 331/57 |
| 5,920,211 | * 7/1999 | Anderson et al. | 327/116 |

OTHER PUBLICATIONS

French Search Report from French Patent Application 97 09529, filed Jul. 21, 1997.

"Critical Path Oscillator" IBM Technical Disclosure Bulletin, vol. 33, No. 1a, Jun. 1990, New York US, pp. 198–200.

* cited by examiner

Primary Examiner—Matthew Smith
Assistant Examiner—A. M. Thompson
(74) Attorney, Agent, or Firm—Wolf, Greenfield & Sacks, P.C.; James H. Morris; Theodore E. Galanthay

(57) ABSTRACT

A circuit for measuring a propagation time of an edge of a signal between an input and an output of a logic cell. The circuit includes a plurality of logic cells of a first type that are electrically coupled in a series, and a plurality of multiplexers, each having a selection input, first and second data inputs, and an output. Each of the plurality of logic cells has a first input and an output, the output of each logic cell in the series being respectively electrically coupled to the first input of a next logic cell in the series. The output of a last logic cell in the series is electrically coupled to the first input of a first logic cell in the series to form a ring. The selection input of each multiplexer of the plurality of multiplexers is electrically coupled to the output of one logic cell in the series, with the output of each multiplexer being electrically coupled to the first input of the next logic cell in the series. The first and second data inputs of each multiplexer are set to different states. Embodiments of the present invention can be used to determine propagation times for each arc of a logic cell and to validate temporal models of logic cells in the context of a logic simulation with delay back annotation.

7 Claims, 2 Drawing Sheets

CIRCUIT FOR VALIDATING SIMULATION MODELS

BACKGROUND OF THE INVENTION

1. Field of the Invention

The present invention generally relates to the simulation of logic circuits and more particular to a specific logic circuit for verifying the suitability of models used for logic simulations.

2. Discussion of the Related Art

FIG. 1 symbolizes a logic cell which may be an elementary logic circuit or a standard cell element. Generally, the cell comprises one or several inputs $A_0, A_1 \ldots A_n$, and at least one output Z. Each path between an input and an output is hereinafter called an "arc".

Such a cell, taken alone, may be analyzed by an analog simulator, such as SPICE, which takes into account the lowest structure level (the transistors) of the cell. The results of the simulation allow all the characteristic parameters of the cell to be acquired, especially the propagation time tp of each arc. A propagation time is the time taken by an edge of a signal applied to the corresponding input A to appear on the output Z, with the same polarity or not.

For a given arc, several propagation times exist. Indeed, a propagation time depends on the polarity or direction of the edge presented at the input and also depends on the states present on the other inputs. Thus, for a single arc, the number of different propagation times is equal to the sum of the number of combinations of the states of the other inputs which sensitize the studied input to positive edges and of the number of combinations of the states of the other inputs which sensitize the studied input to negative edges. An input is so called "sensitized" when an edge applied to this input effectively causes an edge on the output of the cell.

The propagation times of each arc may be found through an analog simulation by using suitable stimulations derived from the logic function of the cell. The accuracy of the results depends on the accuracy of the transistor models used by the simulator. The transistor models involve parameters which depend on the technology to simulate.

Refining the parameters of the models of an analog simulator is achieved throughout the maturation period of a technology. At the birth of a technology, the parameters are unknown and roughly estimated, which does not provide satisfactory results. Refining of the parameters is achieved by comparing numerous measurement results to simulation results.

In practice, a logic circuit may be constructed from several thousand standard cells. It is then not reasonable to simulate the entire logic circuit with an analog simulator, because this would take too much time. One then uses a logic simulation, allowed in particular by functional simulation languages, such as VHDL or VERILOG.

A logic simulation takes into account the logic functions of the cells and precomputed propagation times. Default values for the propagation times tp may be provided by an analog simulation of the cells. These default values are generally corrected in a back-annotation process from the values computed by a delay calculator which takes into account the silicon layout of the simulated circuit (i.e. the effective capacitances of the interconnections after routing).

However, it is not possible to use all the propagation times of each arc of each cell, because the simulation would then again take too much time and would need an enormous data base.

A common way to proceed is to use the worst case situation, i.e. one uses the highest propagation time for each arc and for each edge polarity.

With this solution, the real circuit will always be faster than what the simulation indicates. In fact, in many cases, the simulation will invalidate the circuit although it would operate conveniently in reality.

A better way to proceed would be to organize, for each arc and each edge polarity, the propagation times in several classes, the criterion for grouping the propagation times in a class being to have a maximum distance between propagation times which is smaller than a given threshold.

Then, one would use the highest propagation time in each class, the class used being determined by a corresponding set of conditions on the states of the inputs of the cell.

However, the conditions which determine a class are often complex and passing classes through a temporal model of a cell raises problems, because most of the design tools do not support this type of modeling (delay calculator, back-annotation, simulation with conditional delays . . . ).

In practice, this solution is not exploited. There are therefore two distinct problems. The first relates to an exhaustive characterization of a cell in order to deduce an acceptable temporal model. The second problem is the validation of the chosen temporal models and their use by design tools (delay calculator, logic simulator with back-annotated delays . . . ) in the context of a design methodology such as it is applied by the user.

SUMMARY OF THE INVENTION

An object of the present invention is to provide a test circuit allowing an accurate and simple determination of all the propagation times of each arc of a logic cell. Another object of the present invention is to provide a test circuit for validating the temporal models of the cells in the context of a logic simulation with delay back-annotation.

These and other objects are achieved by a circuit for measuring the propagation time of an edge of a signal between an input and an output of a logic cell, comprising several logic cells of same type connected in a ring, a same input to be tested of each cell being connected to the output of a respective multiplexer having a selection input connected to the output of a previous cell, and two data inputs set to different states.

According to an embodiment of the invention, the states of the data inputs of the multiplexers are chosen so that the inputs of the cells successively receive an edge of same polarity between two successive edges of an output signal of the ring, an inverting element being connected in the ring.

According to an embodiment of the invention, each cell has several inputs among which only one is tested, each non tested input of a cell being connected to the output of a respective multiplexer having a selection input connected to the output of a preceding cell, and two data inputs set to a same state chosen for sensitizing the input which is tested.

According to an embodiment of the invention, the data inputs of the multiplexers associated with a same input of the cells are connected in parallel.

According to an embodiment of the invention, the outputs of the multiplexers and of the cells are connected to capacitors of large capacitance with respect to the input capacitance of the cells and of the multiplexers.

According to an embodiment of the invention, the circuit comprises several rings associated with different cells to test, a first ring serving to test multiplexers with a first combination of different states on their data inputs, a second ring serving to test multiplexers with a second combination of different states on their inputs, and a third ring serving to test inverting elements.

According to an embodiment of the invention, the circuit comprises, for each cell to test, a first ring in which the outputs of the cells and of the multiplexers are connected to capacitors of large capacitance with respect to the input capacitance of the cells and of the multiplexers, and a second ring in which the outputs of the cells and of the multiplexers are not connected to capacitors.

The foregoing and other objects, features, aspects and advantages of the invention will become apparent from the following detailed description of embodiments, given by way of illustration and not of limitation with reference to the accompanying drawings.

DETAILED DESCRIPTION

Figure 1:
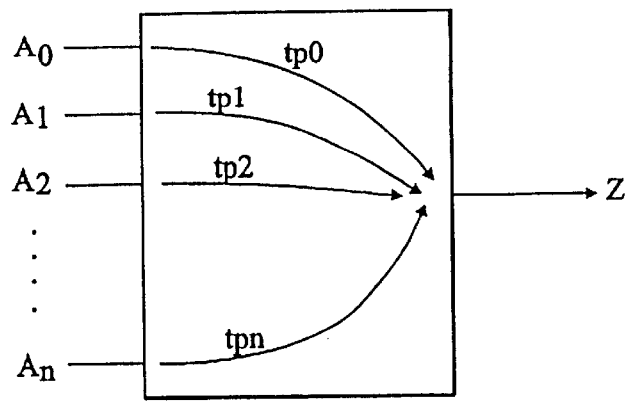
FIG. 1, previously described, symbolizes a logic cell.
Figure 2:
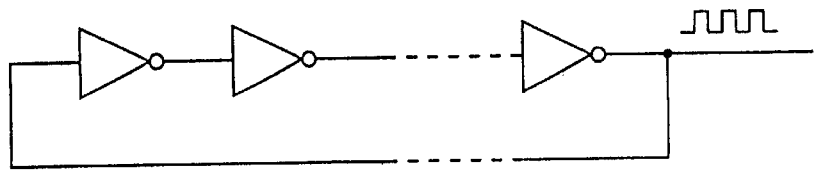
FIG. 2 shows an oscillating ring of inverters allowing an average propagation time of an inverter to be measured.

FIG. 2 shows a conventional oscillator comprised of an odd number of inverters connected in a ring.

A rectangular signal having a duty cycle substantially equal to 50% is present at the output of any of the inverters. The half-period of the output signal is equal to the time taken by an edge at the input of the first inverter to appear at the output of the last inverter. This time is the sum of the propagation times of the inverters.

However, among the 2k+1 inverters of the ring, k inverters receive a given edge while the k+1 remaining inverters receive an edge of opposite polarity. The propagation time $t_{+-}$ of an inverter receiving a positive or rising edge is different from the propagation time $t_{-+}$ of an inverter receiving a negative or falling edge (the signs "+" and "−" indicate the respective polarities of the incoming and outgoing edges). As a result, the firs half-period of the signal produced by the ring differs from the second half-period by the value $t_{+-}-t_{-+}$. This value, too small, is not measurable and does not allow to independently determine the values $t_{+-}$ and $t_{-+}$.

Figure 3:
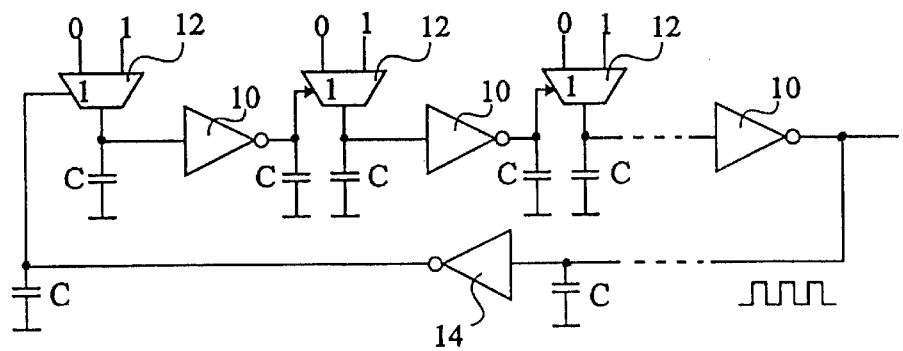
FIG. 3 shows an oscillating ring according to the present invention allowing an independent measurement of the propagation times of an inverter for positive edges and negative edges.

FIG. 3 shows an embodiment of an oscillating ring according to the present invention allowing, in the example of an inverter, an independent determination of the propagation time $t_{+-}$ of the positive edges and of the propagation time $t_{-+}$ of the negative edges.

In this ring, the input of each inverter 10 receives the output of a respective multiplexer 12 having two data inputs. The selection input of each multiplexer 12 is connected to the output of the preceding inverter 10.

Figure 4:
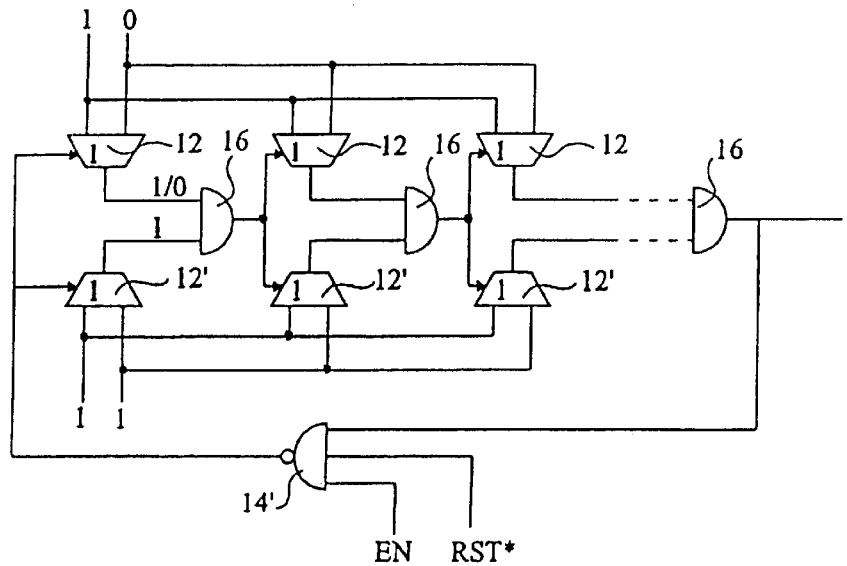
FIG. 4 shows a ring allowing an independent measurement of the propagation times of each arc of a multiple input cell.

The multiplexers 12 have two functions according to the invention. A first function is to implement a programmable inverter, i.e. an element which, in a first state, inverts the signal it receives and, in a second state, does not invert the signal. For this purpose, the two data inputs of each multiplexer 12 receive opposite logic states. The second function of multiplexers 12, which will be described in more detail in relation with FIG. 4, is to set the state of a non tested input. For this purpose, the two data inputs of each multiplexer are set at a same state, the state which should be applied to the non tested input.

Moreover, when the arcs to be tested are inverting, as is the case in FIG. 3, the multiplexers 12 are set in an inverting mode. Each multiplexer 12 then receives on its first input state 0 and on its second input state 1, the first input being the one selected when the selection input is at 1. In FIG. 3, when a multiplexer receives state 1 from the previous inverter, it provides value 0 and when it receives state 0 it provides value 1.

If the arcs to be tested are non inverting, which will be seen in relation with FIG. 4, the states of the two data inputs of each multiplexer 12 are reversed, which makes the multiplexers non inverting.

As a consequence, each cell to be tested (10) preceded by its multiplexer 12 constitutes a non inverting element. To make the ring comprised of these elements oscillate, an additional inverter 14 is inserted in the ring.

In FIG. 3, between two edges of the output signal of the ring, all the inverters 10 receive an edge of same polarity. This is also true for the multiplexers 12. As a consequence, the duration of a predetermined state of the output signal (a "half period") involves the same propagation time of an inverter and a same propagation time of a multiplexer. If the propagation time through the multiplexers 12 and the inverter 14 is known, it will be easy to deduce the propagation time of inverters 10 by measuring the "half periods" of the output signal. This will be described in more detail later.

FIG. 4 shows an embodiment of an oscillating ring according to the invention for testing, as an example, the arcs of an AND gate 16.

An AND gate 16 only has non inverting arcs. Thus, the multiplexers 12 associated to the arcs to be tested, are set in a non inverting mode, i.e. the data inputs selected by a "1" are set to "1" and the data inputs selected by a "0" are set to "0".

Moreover, an input of an AND gate is only sensitized if its other input is at "1". Thus, the other inputs of gates 16 are connected to the outputs of respective multiplexers 12', connected in the same manner as multiplexers 12, but having their two data inputs at "1".

Generally speaking, each input of any cell to test is preceded by a multiplexer. This multiplexer is set in an inverting or non inverting mode, like multiplexers 12, when the corresponding input is to be tested. The multiplexer preceding any input which is not tested is connected like multiplexers 12' for setting the state of the corresponding input to a value sensitizing the input to test.

The additional inverter 14 of FIG. 3 may be replaced by a NAND gate 14 having a first input which receives the output of the last cell 16 to test, having a second input which receives an enable signal EN, and having a third input which receives the complement RST* of a reset signal. When a test circuit includes several rings for testing different cells, such a gate 14' will serve to reset the rings at the beginning of a test and to enable a single ring at one time.

Of course, for the correctness of the measures provided by a circuit according to the invention, each cell of the ring should be tested in the same conditions. In particular, a same arc is tested in each of the cells of a ring, even if these cells have a symmetric logic function, like an elementary logic gate. Indeed, the internal structure of an elementary logic gate is not symmetric and the propagation times of each arc of such a gate are indeed different. Thus, the data inputs of the multiplexers associated with a same cell input are connected in parallel.

Figure 5:
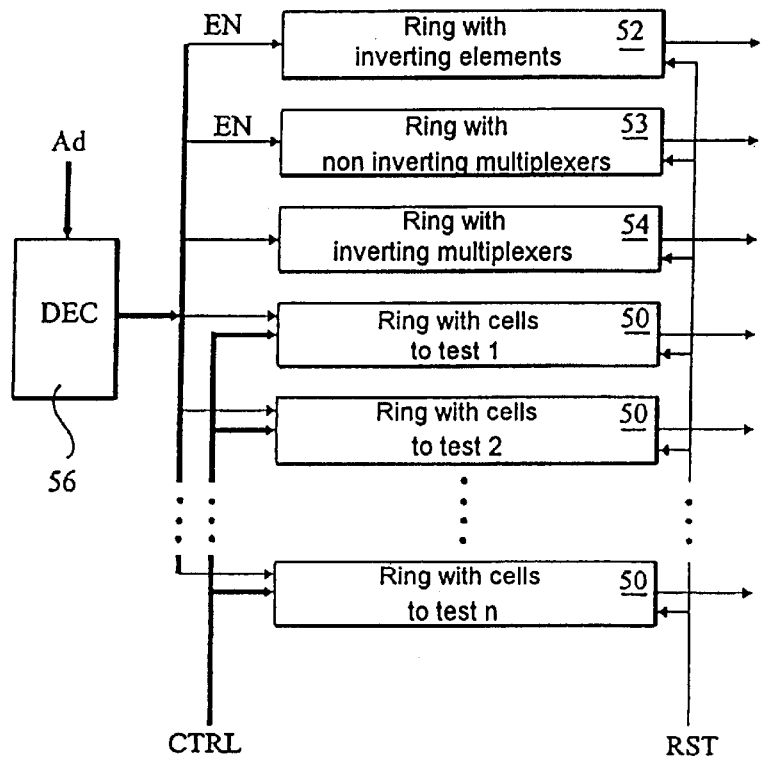
FIG. 5 shows an architecture of a test circuit for achieving measures on all the cells of a standard logic cell library.

FIG. 5 schematically shows a test circuit according to the invention. This test circuit comprises a set of rings 50, of the type of FIG. 4, for testing a set of logic cells, for example those of a library. The data inputs of the multiplexers of rings 50 are connected to lines of a common control bus CTRL. The number of lines of the control bus CTRL is equal to double the number of inputs of the cell having the greatest number of inputs.

In addition to the rings 50 for testing the cells of a library, the circuit comprises special rings. A first special ring 52 serves to test the inverting elements 14'. This ring may exceptionally be comprised only of inverting elements 14'.

A second special ring 53 serves to test the multiplexers 12 in non inverting mode. The ring is simply comprised of multiplexers 12 directly connecting one to the other.

A third special ring 54 serves to test the multiplexers in inverting mode. Each multiplexer is preceded by an inverting element 14'.

The data inputs of the multiplexers of special rings 52 to 54 are set at fixed states and are thus not connected to control bus CTRL.

A single ring at one time is selected by an address decoder 56 which enables signal EN of this ring according to an address Ad. At the same time, suitable states are applied to the lines of the control bus CTRL in order to determine the desired propagation times of the cell of the selected ring. A general reset line RST is connected to all the rings.

If the arc of a tested cell in a ring 50 is inverting, the test circuit allows the following two equations to be established:

$$TH50 = t14_{+-} + n(t12_{-+} + t50_{+-})$$

$$TL50 = t14_{-+} + n(t12_{+-} + t50_{-+})$$

Value TH50 is the time measured for the half periods at a high state of the output signal of the selected ring 50 and value TL50 is the measured value for a half period at a low state of the output signal. Signs "+" and "−" designate the respective polarities of the input and output edges of an arc. The values t50 are the propagation times which should be determined, the values t12 are propagation times of a multiplexer 12, the values t14 are propagation times of an inverting element 14', and n is the number of cells tested in a ring.

It is desired to calculate the times $t50_{+-}$ and $t50_{-+}$ from the measured times TH50 and TL50. It is thus necessary to know the two times t12 and the two times t14. For this purpose, the special rings 52 and 54 are used for establishing the following four equation system with four unknown values:

$$TH52 = t14_{+-} + n(t14_{++} + t14_{+-})$$

$$TL52 = t14_{-+} + n(t14_{+-} + t14_{-+})$$

$$TH54 = t14_{+-} + n(t12_{++} + t14_{+-})$$

$$TL54 = t14_{-+} + n(t12_{+-} + t14_{-+})$$

However, ring 52 being only comprised of inverting elements, the problem mentioned in relation with FIG. 2 arises, i.e. it is difficult to measure a difference between the times TH52 and TL52, which difference is equal to $t14_{+-} - t14_{-+}$. As a result, the two last equations hereabove are equivalent and do not allow to individually calculate the times $t14_{+-}$ and $t14_{-+}$.

A first solution is to consider that the two times $t14_{+-}$ and $t14_{-+}$ are equal, which constitutes a reasonable approximation, because a simple inverting element, such as a NAND gate 14', has almost equal propagation times.

A more accurate solution is to introduce an additional equation by using the results of an electric simulation of the inverter element. The additional equation may be of the type $t14_{+-} = k \cdot t14_{-+}$, where coefficient k, equal to the ratio of the propagation times provided by the simulation, is approximately equal to 0.9 for a simple inverting element in a current technology.

When the arcs to test in a ring 50 are non inverting, the test circuit allows the following equations to be established:

$$TH50 = t14_{+-} + n(t12_{--} + t50_{--})$$

$$TL50 = t14_{-+} + n(t12_{++} + t50_{++})$$

The special ring 53 allows the following equations to be established:

$$TH53 = t14_{+-} + n \cdot t12_{--}$$

$$TL53 = t14_{-+} + n \cdot t12_{++}$$

from which one determines the propagation times $t12_{++}$ and $t12_{--}$, the times t14 having been calculated above.

In order to allow optional measures, the rings of a test circuit according to the invention may comprise other elements. In this case, additional special rings are provided for determining the propagation times of these elements.

A test circuit according to the invention allows all the propagation times of logic cells of a library to be tested.

When these cells are implemented in a new technology, the measured parameters may directly serve to constitute analog simulation models (SPICE). If the technology is already mature, the measured propagation times may be compared with the propagation times provided by the analog simulator, in order to check the coincidence and eventually correct the parameters of the models of the analog simulator.

Of course, the measured propagation times depend on the capacitances of the interconnections between the cells of the test circuit. For a comparison between the test circuit and the simulated circuit (logically or analogically) to be valid, the capacitances of the interconnections should be estimated and provided as parameters to the simulation. In order to avoid this step and the errors it may introduce, it is preferred, as shown in FIG. 3, to connect a capacitor C to each output of the elements placed in the rings of the test circuit. Capacitors C have a large value with respect to normal values of interconnection lines. They are constructed with transistors whose gate capacitance is accurately known. Thus, the capacitances of the interconnection lines may be neglected and the values of these capacitors will be provided as simulation parameters instead of the capacitances of the interconnection lines.

In order to multiply the test possibilities, the test circuit may include, for each cell, a first ring having capacitors C and a second ring not having capacitors C.

A test circuit according to the invention moreover allows checking or optimizing the tradeoffs and the choices achieved in a logic simulator. A test circuit according to the invention, constructed from a great number of logic cells, is of a size comparable to that of a circuit typically realized in a given technology. By submitting this test circuit to a logic simulator, it will reveal the accuracy flaws which the simulator has with a normal circuit. The parameters of the simulator may then be optimized for improving the simulation results.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A circuit for measuring a propagation time of an edge of a signal between an input and an output of a logic cell, comprising:

a plurality of logic cells of a first type that are electrically coupled in a series, each of the plurality of logic cells having a first input and an output, the output of each logic cell in the series being respectively electrically coupled to the first input of a next logic cell in the series, with the output of a last logic cell in the series being electrically coupled to the first input of a first logic cell in the series to form a ring; and a plurality of multiplexers each having a selection input first and second data inputs, and an output;

wherein the selection input of each multiplexer of the plurality of multiplexers is electrically coupled to the output of one logic cell in the series, the output of each multiplexer is electrically coupled to the first input of the next logic cell in the series, and wherein the first and second data inputs of each multiplexer are set to different states.

2. The circuit according to claim 1, wherein the different states of the first and second data inputs of each multiplexer of the plurality of multiplexers are chosen so that the first input of each logic cell in the series successively receives an edge having a first polarity between two successive edges of an output signal at the output of the last logic cell in the series, and wherein the circuit farther comprises an inverting element that is connected in the ring.

3. The circuit according to claim 2, wherein each of the plurality of logic cells has a plurality of inputs among which only the first input is tested, and wherein the plurality of multiplexers is a first plurality of multiplexers, the circuit further comprising:

a second plurality of multiplexers each having a selection input, first and second data inputs and an output, wherein the selection input of each multiplexer of the second plurality of multiplexers is electrically coupled to the output of one logic cell in the series, the output of each multiplexer of the second plurality of multiplexers is electrically coupled to each non tested input of the plurality of inputs of the next logic cell in the series, and wherein the first and second data inputs of each multiplexer of the second plurality of multiplexers are set to a same state chosen for sensitizing the first input.

4. The circuit according to claim 2, wherein the first data input of each of the plurality of multiplexers is connected in parallel, and wherein the second data input of each of the plurality of multiplexers is connected in parallel.

5. The circuit according to claim 1, wherein the outputs of each of the plurality of multiplexers and of each of the plurality of logic cells are connected to a respective capacitor of large capacitance with respect to an input capacitance of each of the plurality of logic cells and of each of the plurality of multiplexers.

6. The circuit according to claim 1, wherein the plurality of multiplexers is a first plurality of multiplexers, the circuit further comprising:

a second plurality of multiplexers electrically coupled in a series, each of the second plurality of multiplexers having a selection input, first and second data inputs, and an output, the first and second data inputs of each of the second plurality of multiplexers being set to a first combination of different states, the output of each of the second plurality of multiplexers being electrically coupled to the selection input of a next multiplexer in the series, and the output of a last multiplexer in the series being electrically coupled to the selection input of a first multiplexer in the series to form a second ring, the second ring serving to test the second plurality of multiplexers with the first combination of different states;

a third plurality of multiplexers electrically coupled in a series, each of the third plurality of multiplexers having a selection input, first and second data inputs, and an output, the first and second data inputs of each of the third plurality of multiplexers being set to a second combination of different states, the output of each of the third plurality of multiplexers being electrically coupled to the selection input of a next multiplexer in the series, and the output of a last multiplexer in the series being electrically coupled to the selection input of a first multiplexer in the series to form a third ring, the third ring serving to test the third plurality of multiplexers with the second combination of different states; and a plurality of inverting elements electrically coupled in a series, each of the plurality of inverting elements having an input and an output, the output of each inverting element in the series being electrically coupled to the input of a next inverting element in the series, with the output of a last inverting element in the series being electrically coupled to a first inverting element in the series to form a fourth ring, the fourth ring serving to test the plurality of inverting elements.

7. The circuit according to claim 6, wherein the output of each of the plurality of logic cells and of each of the first plurality of multiplexers are connected to a respective capacitor of large capacitance with respect to an input capacitance of each of the plurality of logic cells and of each of the first plurality of multiplexers.

* * * * *

UNITED STATES PATENT AND TRADEMARK OFFICE
CERTIFICATE OF CORRECTION

PATENT NO. : 6,253,352 B1
DATED : June 26, 2001
INVENTOR(S) : Stéphane Hanriat and Jean-Pierre Schoellkopf It is certified that error appears in the above-identified patent and that said Letters Patent is hereby corrected as shown below:

<u>Column 4,</u>
Line 56, should read: a NAND gate 14' having a first input which receives the Signed and Sealed this Twenty-second Day of January, 2002

Attest:

JAMES E. ROGAN
*Attesting Officer*     *Director of the United States Patent and Trademark Office*